United States Patent
Choi et al.

(10) Patent No.: US 7,436,204 B2
(45) Date of Patent: Oct. 14, 2008

(54) APPARATUS AND METHOD FOR DETERMINING ON DIE TERMINATION MODES IN MEMORY DEVICE

(75) Inventors: Sung-Ho Choi, Yongin-si (KR); Reum Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/890,673

(22) Filed: Aug. 7, 2007

(65) Prior Publication Data
US 2008/0100335 A1   May 1, 2008

(30) Foreign Application Priority Data
Oct. 27, 2006   (KR) .................. 10-2006-0105039

(51) Int. Cl.
*H03K 19/003*   (2006.01)
(52) U.S. Cl. .................................. 326/30; 326/16

(58) Field of Classification Search .................. 326/30, 326/16
See application file for complete search history.

(56) References Cited

U.S. PATENT DOCUMENTS

| | | | |
|---|---|---|---|
| 6,847,225 B2 | 1/2005 | Viehmann et al. | 326/30 |
| 7,196,966 B2 * | 3/2007 | Jin | 365/233.11 |
| 7,285,979 B2 * | 10/2007 | Janzen et al. | 326/30 |
| 7,317,328 B2 * | 1/2008 | Kim | 326/30 |

OTHER PUBLICATIONS

Korean Patent Application No. 1020040020764 to So et al., having Publication date of Sep. 29, 2005 (w/ English Abstract page).
Korean Patent Application No. 1020040066531 to Park, having Publication date of Jun. 29, 2005 (w/ English Abstract page).
Japanese Patent Application No. 2000-090387 to Hirobumi, having Publication date of Oct. 12, 2001 (w/ English Abstract page).

* cited by examiner

*Primary Examiner*—James H Cho
(74) *Attorney, Agent, or Firm*—Monica H. Choi

(57) ABSTRACT

For determining an on die termination (ODT) mode in a semiconductor memory device, a first mode determining unit determines whether or not a normal ODT mode is enabled from performing a logic operation on a first set of signals. A second mode determining unit determines whether or not a dynamic ODT mode test is enabled from performing a logic operation on a second set of signals. One of the normal and dynamic ODT modes is enabled with more flexibility.

20 Claims, 7 Drawing Sheets

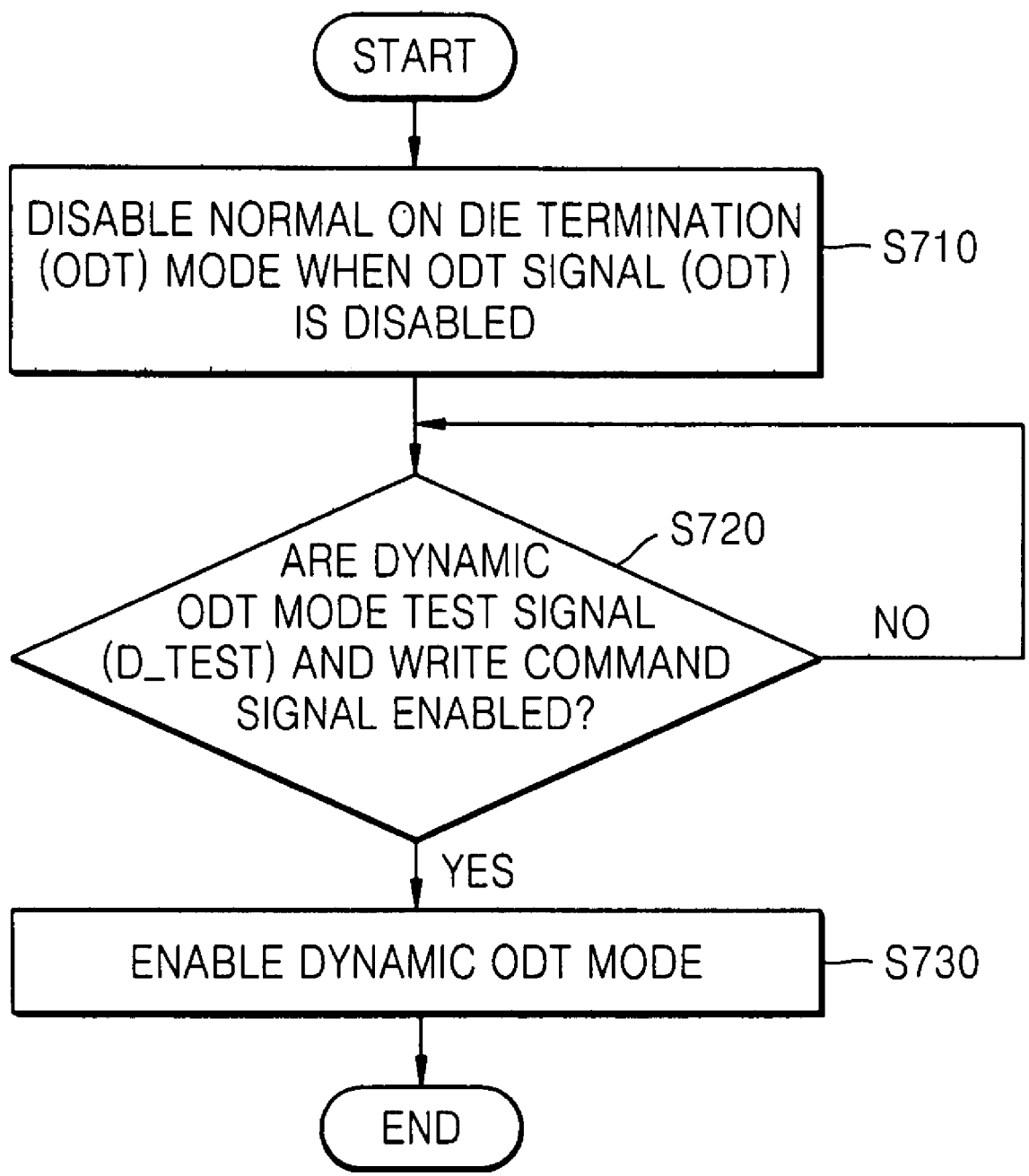

APPARATUS AND METHOD FOR DETERMINING ON DIE TERMINATION MODES IN MEMORY DEVICE

BACKGROUND OF THE INVENTION

This application claims priority under 35 USC § 119 to Korean Patent Application No. 2006-105039, filed on Oct. 27, 2006 in the Korean Intellectual Property Office, the disclosure of which is incorporated herein in its entirety by reference.

1. Field of the Invention

The present invention relates generally to on die termination in semiconductor memory devices, and more particularly, to determining on die termination modes in a semiconductor memory device.

2. Background of the Invention

On die termination (ODT) is used for improving signal integrity (SI) by minimizing signal reflection at an interface between a system and a memory device. In particular, signal reflection more significantly degrades SI in a memory system having high-speed operations. For suppressing signal reflection, a transmission line for signal transmission between the system and the memory device is terminated at a termination register (RTT).

Conventionally, input/output terminals of a memory controller or the memory device in the memory system include the ODT terminated at the RTT. The RTT is set to match an impedance of the transmission line.

The following is a brief description regarding the termination of the transmission line at the RTT. Assuming that there is a memory module with two memory ranks, when data is read from a memory in a first rank by the memory controller, an activated ODT signal is applied to a memory in a second rank by the memory controller. Then, the memory in the second rank forms a termination on a data bus shared with the first rank. This is called "termination register (RTT) formation".

A specific example of a memory module comprising an ODT circuit is provided in U.S. Pat. No. 6,847,225, to Viehmann et al. issued on Jan. 25, 2005.

FIG. 1 is a timing diagram illustrating a normal ODT mode and a dynamic ODT mode. As described above, ODT is conventionally used to enhance the SI. Furthermore, in order to enhance SI when writing, the dynamic ODT mode is applied to Double Data rate, third generation memory chips (DDR3). Since an RTT for optimizing the SI in normal operation is different from that in the writing operation, the dynamic ODT mode is used for the writing operation. In other words, a DDR3 memory chip operates in the normal ODT mode and the dynamic ODT mode.

When the ODT signal is activated to a logic high state, the normal ODT mode is enabled so that the data bus is terminated at a normal termination register RTT_N. In the prior art, if a write command signal WC is activated while the ODT signal is activated so that the normal ODT mode is enabled, the dynamic ODT mode is enabled so that the data bus is terminated at a dynamic termination register RTT_D. In other words, only when the write command signal WC is activated in a state where the ODT signal is activated so that the normal ODT mode is enabled, the dynamic ODT mode is subsequently enabled.

Verification of enablement of the normal ODT mode is possible in the prior art. However, verification of enablement of the dynamic ODT mode is difficult in the prior art because the dynamic ODT mode is enabled while the normal ODT mode is also enabled.

SUMMARY OF THE INVENTION

Accordingly, the present invention determines enablement of the normal ODT mode and the dynamic ODT mode in a semiconductor memory device with more flexibility.

For determining an on die termination (ODT) mode in a semiconductor memory device according to an aspect of the present invention, a first mode determining unit disables a normal ODT mode when a dynamic ODT mode test is performed. In addition, a second mode determining unit enables a dynamic ODT mode when a write command is generated.

In an example embodiment of the present invention, the first mode determining unit determines whether the normal ODT mode is enabled from an ODT signal, a dynamic ODT mode test signal, and a write command signal. Furthermore, the second mode determining unit determines whether the dynamic ODT mode is enabled from the ODT signal and the write command signal.

In another embodiment of the present invention, the first mode determining unit enables the normal ODT mode when the ODT signal is activated, the dynamic ODT mode test signal is deactivated, and the write command signal is deactivated. In addition, the second mode determining unit enables the dynamic ODT mode when the ODT signal and the write command signal are activated.

In an example embodiment of the present invention, the first mode determining unit includes a first NAND gate and a first inverter. The first NAND gate inputs the ODT signal, an inversion of the dynamic ODT mode test signal, and an inversion of the write command signal. The first inverter inputs an output of the first NAND gate. Furthermore, the second mode determining unit includes a second NAND gate and a second inverter. The second NAND gate inputs the ODT signal and the write command signal. The second inverter inputs an output of the second NAND gate.

In a further embodiment of the present invention, a normal mode latency unit generates a normal ODT enable (N_ODT_EN) signal with a delay from an output of the first inverter. In addition, a dynamic mode latency unit generates a dynamic ODT enable (D_ODT_EN) signal with a delay from an output of the second inverter.

For determining an on die termination (ODT) mode in a semiconductor memory device according to another aspect of the present invention, a first mode determining unit disables a normal ODT mode when an ODT signal is deactivated or a write command is generated. In addition, a second mode determining unit enables a dynamic ODT mode when the write command is generated and a dynamic ODT mode test is performed.

In an example embodiment of the present invention, the first mode determining unit determines whether the normal ODT mode is enabled from an ODT signal and a write command signal. Furthermore, the second mode determining unit determines whether the dynamic ODT mode is enabled from the ODT signal, a dynamic ODT mode test signal, and the write command signal.

In a further embodiment of the present invention, the first mode determining unit enables the normal ODT mode when the ODT signal is activated and the write command signal is deactivated. In addition, the second mode determining unit enables the dynamic ODT mode when at least one of the ODT signal and the dynamic ODT mode test signal is activated and when the write command signal is activated.

For example, the first mode determining unit includes a first NAND gate and a first inverter. The first NAND gate inputs the ODT signal and an inversion of the write command signal. The first inverter inputs an output of the first NAND gate. Additionally, the second mode determining unit includes a NOR gate, a second NAND gate, and a second inverter. The NOR gate inputs the ODT signal and the dynamic ODT mode test signal. The second NAND gate inputs the inversion of the output of the NOR gate and the write command signal. The second inverter inputs an output of the second NAND gate.

In another embodiment of the present invention, a normal mode latency unit generates a normal ODT enable (N_ODT_EN) signal with a delay from an output of the first inverter. Furthermore, a dynamic mode latency unit generates a dynamic ODT enable (D_ODT_EN) signal with a delay from an output of the second inverter.

By using such signals and such logic elements, the normal ODT mode and the dynamic ODT mode are enabled with more flexibility in the present invention.

BRIEF DESCRIPTION OF THE DRAWINGS

The above and other features and advantages of the present invention will become more apparent when described in detailed exemplary embodiments thereof with reference to the attached drawings in which:

FIG. 7 is a flow chart of steps during operation of the ODT mode test apparatus of FIG. 5 according to an embodiment of the present invention.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to one skilled in the art.

Figure 2:
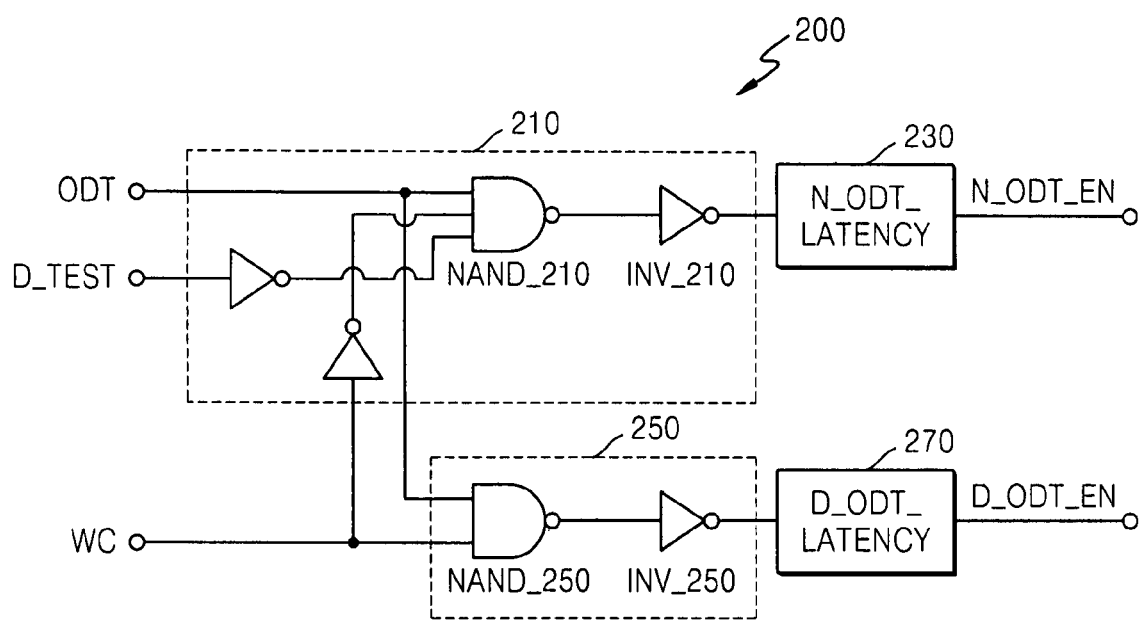
FIG. 2 is a block diagram of an ODT mode test apparatus according to an embodiment of the present invention.

FIG. 2 is a block diagram of an on die termination (ODT) mode test apparatus 200 according to an embodiment of the present invention. Referring to FIG. 2, the ODT mode test apparatus 200 includes a first mode determining unit 210, a normal ODT latency unit N_ODT_LATENCY 230, a second mode determining unit 250, and a dynamic ODT latency unit D_ODT_LATENCY 270.

The first mode determining unit 210 determines whether or not a normal ODT mode is enabled in response to a dynamic ODT mode test signal D_TEST, an ODT signal ODT, and a write command signal WC. The dynamic ODT mode test signal D_TEST is activated to a first logic state when a dynamic ODT mode test is being performed, and is deactivated to a second logic state when the dynamic ODT mode test is not being performed. For example, hereafter, the first logic state means a logic high state, and the second logic states means a logic low state.

The ODT signal ODT is activated to the first logic state when another memory device of another memory rank is being accessed, and is deactivated to the second logic state otherwise. The write command signal WC is activated to the fist logic state when a write command is generated, and is deactivated to the second logic state otherwise.

The first mode determining unit 210 disables the normal ODT mode when the dynamic ODT mode test signal D_TEST is activated to the logic high state. Furthermore, if the ODT signal ODT is activated to the logic high state, the first mode determining unit 210 enables the normal ODT mode when the dynamic ODT mode test signal D_TEST is deactivated to the logic low state.

The second mode determining unit 250 determines whether or not a dynamic ODT mode is enabled in response to the ODT signal ODT and the write command signal WC. In other words, the second mode determining unit 250 enables the dynamic ODT mode if the write command signal WC is activated to the logic high state even when the normal ODT mode is disabled by the first mode determining unit 210.

When the dynamic ODT mode is enabled, a data bus is terminated at a dynamic termination register RTT_D. When the normal ODT mode is enabled, the data bus is terminated at a normal termination register RTT_N.

Referring to the example embodiment of FIG. 2, the first mode determining unit 210 includes a first NAND gate NAND_210 and a first inverter INV_210. The first NAND gate NAND_210 inputs an inversion of the dynamic ODT mode test signal D_TEST, the ODT signal ODT, and an inversion of the write command signal.

The first NAND gate NAND_210 performs a NAND operation on such signals, and the output of the first NAND gate NAND_210 is input by the first inverter INV_210. The output of the first inverter INV_210 is input by the normal mode latency unit 230 that generates a normal ODT enable (N_ODT_EN) signal with a first delay from the output of the first inverter INV_210. The normal ODT enable (N_ODT_EN) signal indicates whether or not the normal ODT mode is enabled.

Furthermore, the second mode determining unit 250 includes a second NAND gate NAND_250 and a second inverter INV_250. The second NAND gate NAND_250 inputs the ODT signal ODT and the write command signal WC for performing a NAND operation on such signals. The second inverter INV_250 inverts the output of the second NAND gate NAND_250.

The output of the second inverter INV_250 is input by the dynamic mode latency unit 270 that generate a dynamic ODT enable (D_ODT_EN) signal with a second delay from an output of the second inverter INV_250. The dynamic ODT enable (D_ODT_EN) signal indicates whether or not the dynamic ODT mode is enabled.

FIG. 2 shows example logic gates used for indicating enablement of one of the normal and dynamic ODT modes. However, other types of logic gates may also be used for implementing the functionality of the ODT mode test apparatus 200.

Figure 1:
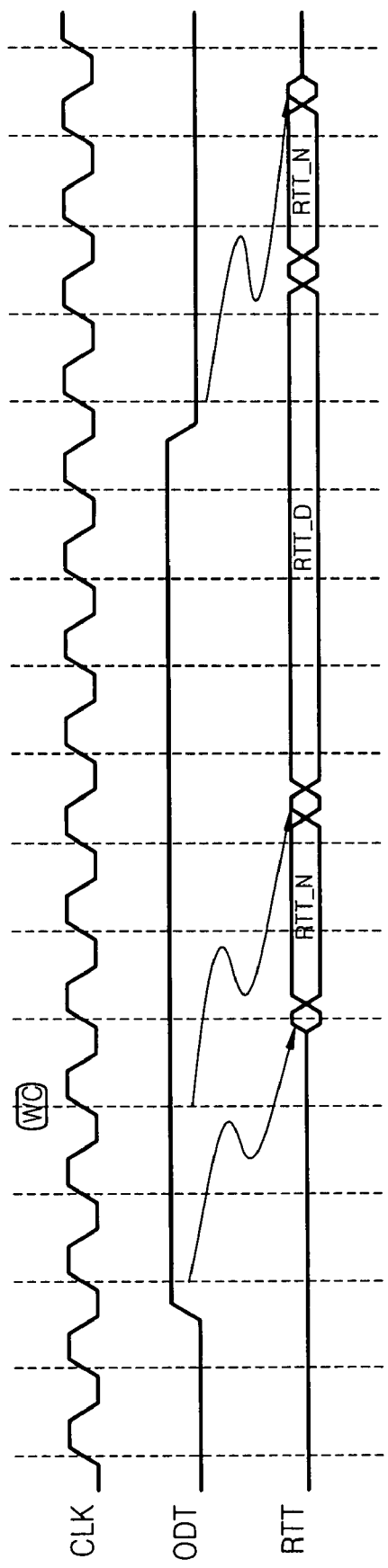
FIG. 1 is a timing diagram illustrating a normal on die termination (ODT) mode and a dynamic ODT mode according to the prior art.

The normal ODT latency unit N_ODT_LATENCY 230 provides desired timing of the enablement of the normal ODT mode a predetermined number of clock cycles after the ODT signal is activated. For example as illustrated in FIG. 1, the normal ODT mode may be desired to be enabled after three clock cycles from when the ODT signal ODT is activated.

The dynamic ODT latency unit D_ODT_LATENCY 270 provides desired timing of the enablement of the dynamic ODT mode a predetermined number of clock cycles after the write command signal WC is activated. For example as illustrated in FIG. 1, the dynamic ODT mode may be desired to be enabled 3.5 clock cycles after the write command signal WC is activated.

Figure 3:
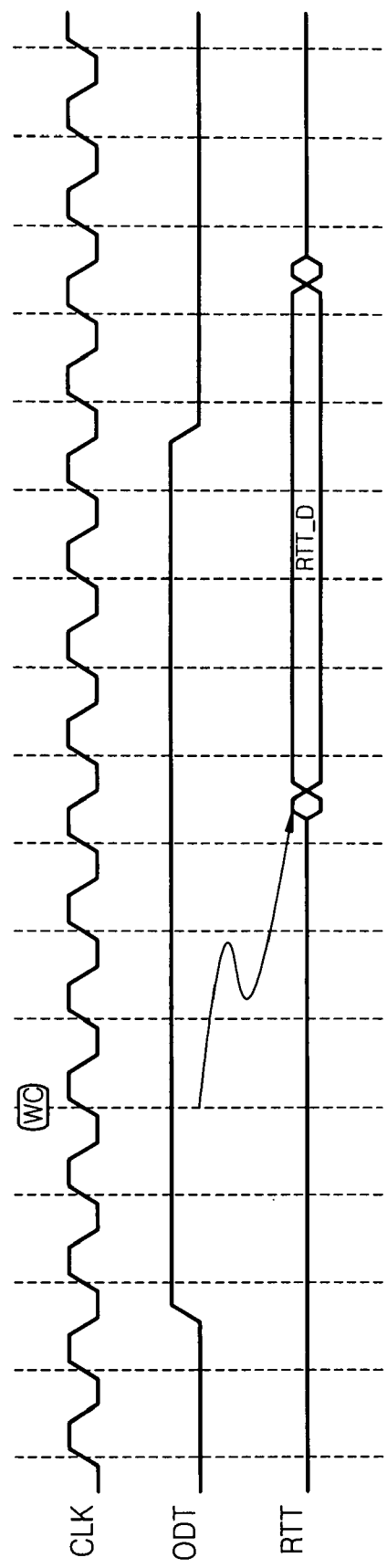
FIG. 3 is a timing diagram of signals during operation of the ODT mode test apparatus of FIG. 2 according to an embodiment of the present invention.
Figure 4:
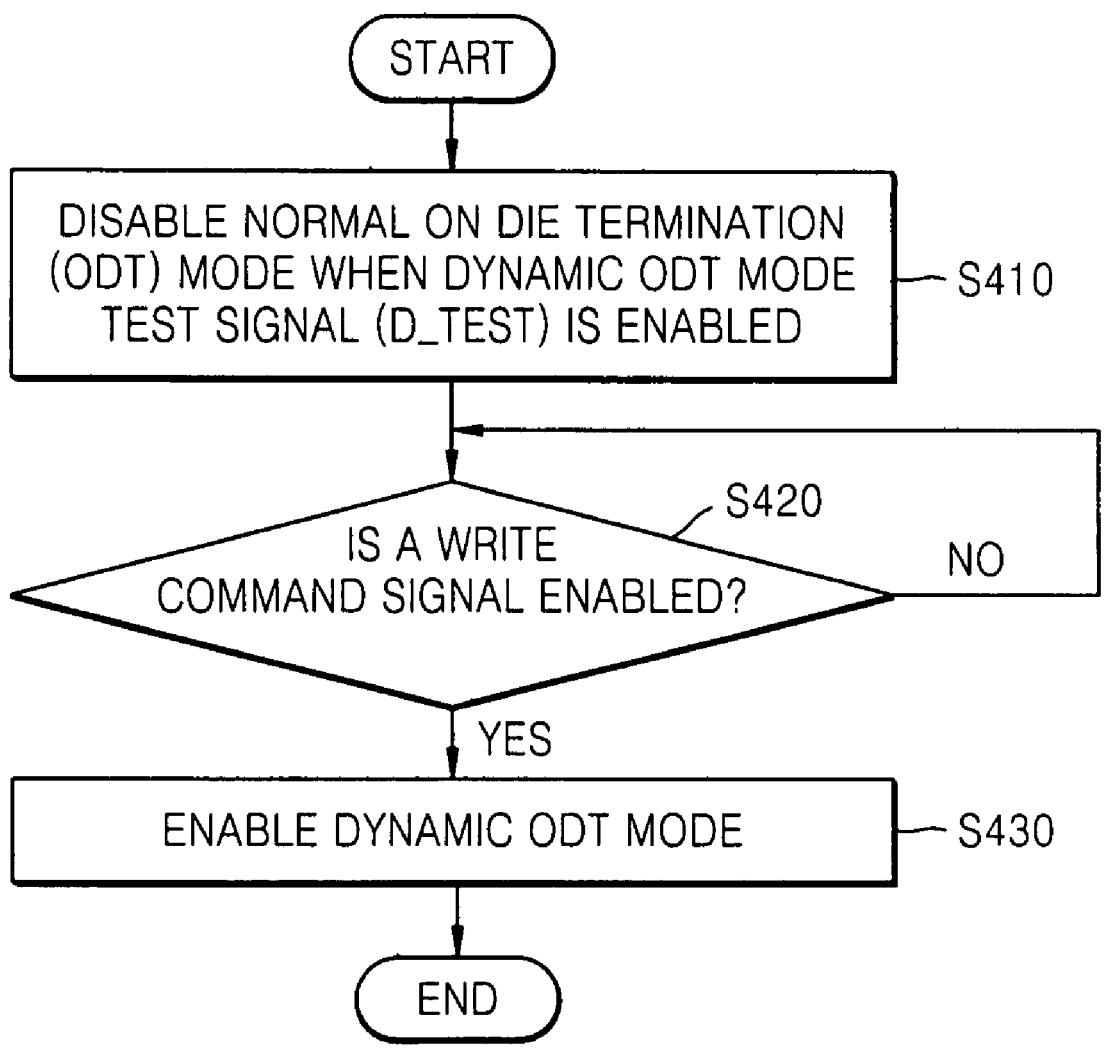
FIG. 4 is a flow chart of steps during operation of the ODT mode test apparatus of FIG. 2 according to an embodiment of the present invention.

FIG. 3 is a timing diagram of signals during operation of the ODT mode test apparatus 200 of FIG. 2 for a dynamic ODT mode test, in one example embodiment of the present invention. FIG. 4 is a flow chart of steps during operation of the ODT mode test apparatus 200 of FIG. 2 for a dynamic ODT mode test, in one example embodiment of the present invention.

In an example embodiment of FIGS. 3 and 4, the dynamic ODT mode test signal D_TEST is activated to the logic high state, and the ODT signal ODT is activated to the logic high state. In the prior art, if the ODT signal ODT is activated, the normal ODT mode is enabled.

In contrast in the present invention, even when the ODT signal ODT is activated to the logic high state, the normal ODT enable signal N_ODT_EN is deactivated to the logic low state when the dynamic ODT mode test signal D_TEST is activated to the logic high state. Thus in that case, the normal ODT mode is disabled (STEP S410). In other words, when the ODT signal ODT and the dynamic ODT mode test signal D_TEST are activated to the logic high state, the first mode determining unit 210 disables the normal ODT mode.

If the write command signal WC is activated to the logic high state when the normal ODT mode is disabled (STEP S420), the dynamic ODT enable signal D_ODT_EN is activated to the logic high state so that the dynamic ODT mode is enabled (STEP S430). In other words, if the ODT signal ODT and the write command signal WC are activated to the logic high state, the second mode determining unit 250 enables the dynamic ODT mode. FIG. 3 illustrates an example of the dynamic ODT mode being enabled after 3.5 clock cycles have passed from when the write command signal WC has been activated.

Figure 5:
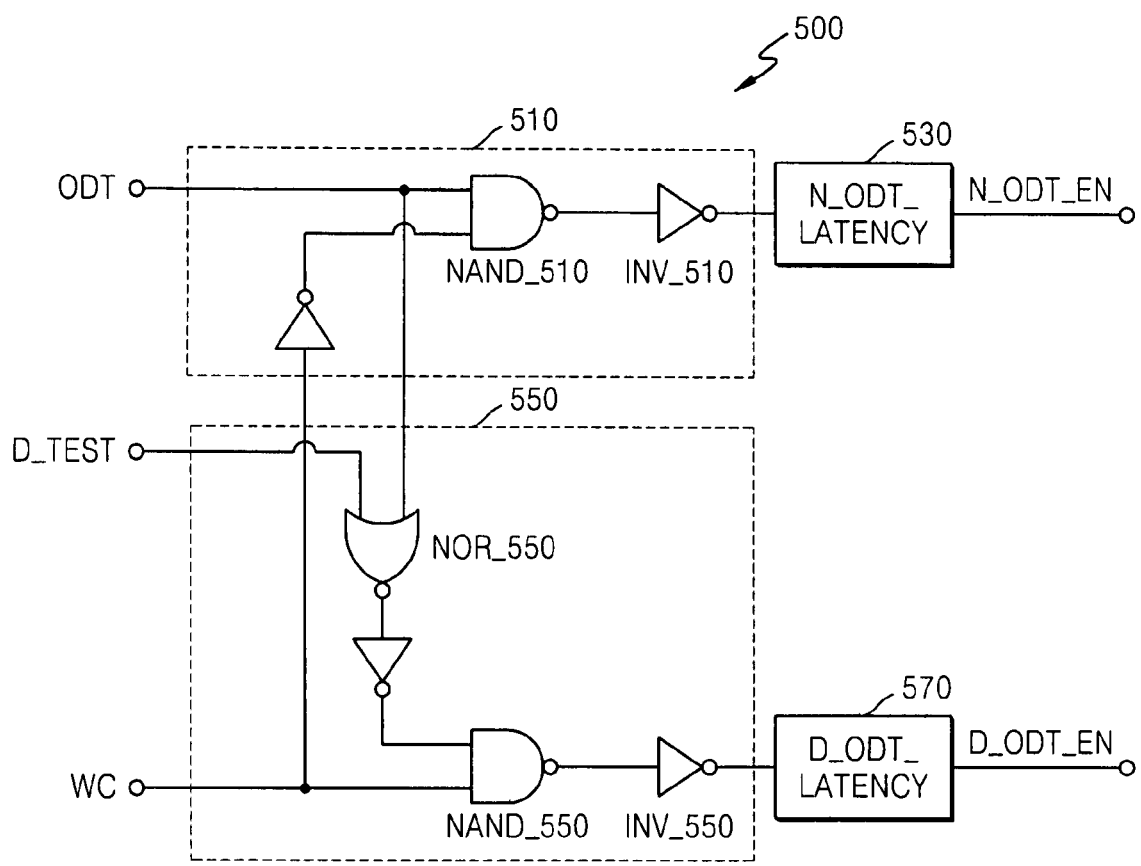
FIG. 5 is a block diagram of an ODT mode test apparatus according to another embodiment of the present invention.

FIG. 5 is a block diagram of an ODT mode test apparatus 500 according to another embodiment of the present invention. Referring FIG. 5, the ODT mode test apparatus 500 includes a first mode determining unit 510, a second mode determining unit 550, a normal ODT latency unit N_ODT_LATENCY 530, and a dynamic ODT latency unit D_ODT_LATENCY 570.

The first mode determining unit 510 determines whether or not the normal ODT mode is enabled in response to the ODT signal ODT and the write command signal WC. In other words, the first mode determining unit 510 disables the normal ODT mode if the ODT signal ODT is deactivated to the logic low state. Furthermore, the first mode determining unit 510 enables the normal ODT mode if the ODT signal ODT is activated to the logic high state (and if the write command signal is deactivated to the logic low state).

The second mode determining unit 550 determines whether or not the dynamic ODT mode is enabled in response to the dynamic ODT mode test signal D_TEST, the ODT signal ODT, and the write command signal WC. In other words, the second mode determining unit 550 enables the dynamic ODT mode if the dynamic ODT mode test signal D_TEST and the write command signal WC are activated to the logic high state even when the normal ODT mode is disabled.

Referring to the example embodiment of FIG. 5, the first mode determining unit 510 includes first a NAND gate NAND_510 and a first inverter INV_510. The first NAND gate NAND_510 inputs the ODT signal ODT and the write command signal WC to perform a NAND operation on such signals. The first inverter INV_510 inputs the output of the first NAND gate NAND_510.

The output of the first inverter INV_510 is input by the normal mode latency unit 530 that generates a normal ODT enable (N_ODT_EN) signal with a first delay from the output of the first inverter INV_510. The normal ODT enable (N_ODT_EN) signal indicates whether or not the normal ODT mode is enabled.

The second mode determining unit 550 includes a NOR gate NOR_550, a second NAND gate NAND_550, and a second inverter INV_550. The NOR gate NOR_550 inputs the ODT signal ODT and the dynamic ODT mode test signal D_TEST for performing a NOR operation on such signals. The second NAND gate NAND_550 inputs an inversion of the output of the NOR gate NOR_550 and the write command signal WC to perform a NAND operation on such signals. The second inverter INV_550 inputs the output of the second NAND gate NAND_550.

The output of the second inverter INV_550 is input by the dynamic mode latency unit 570 that generate a dynamic ODT enable (D_ODT_EN) signal with a second delay from an output of the second inverter INV_550. The dynamic ODT enable (D_ODT_EN) signal indicates whether or not the dynamic ODT mode is enabled.

FIG. 5 shows example logic gates used for indicating enablement of one of the normal and dynamic ODT modes. However, other types of logic gates may also be used for implementing the functionality of the ODT mode test apparatus 500.

Figure 6:
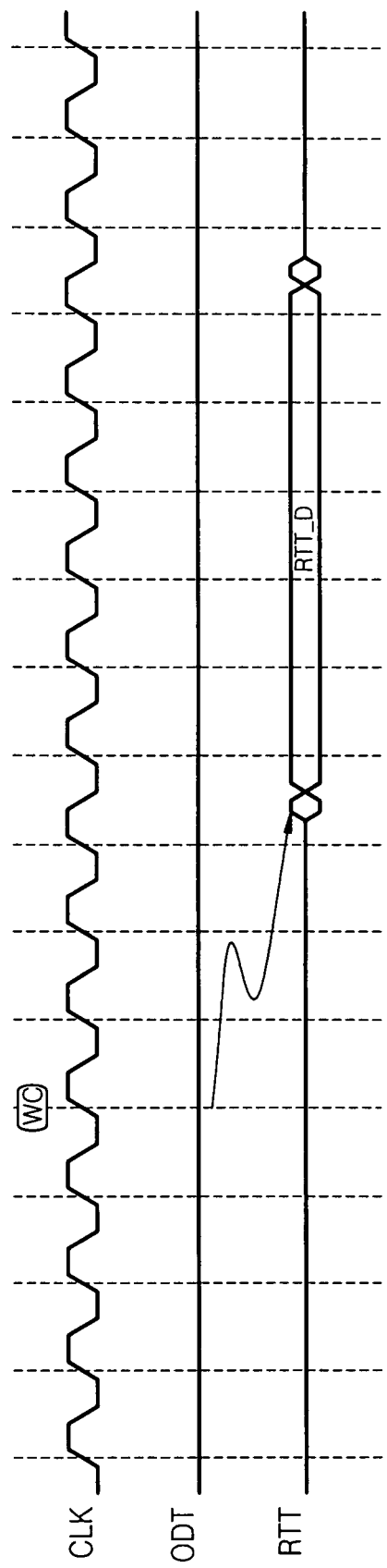
FIG. 6 is a timing diagram of signals during operation of the ODT mode test apparatus of FIG. 5 according to an embodiment of the present invention.

FIG. 6 is a timing diagram of signals during operation of the ODT mode test apparatus 500 of FIG. 5 for a dynamic ODT mode test, in one example embodiment of the present invention. FIG. 7 is a flow chart of steps during operation of the ODT mode test apparatus 500 of FIG. 5 for a dynamic ODT mode test, in one example embodiment of the present invention.

In an example embodiment of FIGS. 6 and 7, the dynamic ODT mode test signal D_TEST is activated to the logic high state, and the ODT signal ODT is deactivated to the logic low state.

In the prior art, if the ODT signal ODT is deactivated, the normal ODT mode and the dynamic ODT mode are not enabled such that the dynamic ODT mode cannot be tested. In contrast in the present invention, even when the ODT signal ODT is deactivated, the dynamic ODT mode is enabled if the dynamic ODT mode test signal D_TEST is activated to the logic high state.

Specifically, if the ODT signal ODT is deactivated, the normal ODT enable signal N_ODT_EN is deactivated so that the normal ODT mode is disabled (STEP S710). In other words, when the ODT signal ODT is deactivated to the logic low state, the first mode determining unit 510 disables the normal ODT mode regardless of the write command signal WC.

Even when the normal ODT mode is disabled, if the dynamic ODT mode test signal D_TEST and the write command signal WC are activated (STEP S720), the dynamic ODT enable signal D_ODT_EN is activated to the logic high state so that the dynamic ODT mode is enabled (STEP S730).

In other words, when the dynamic ODT mode test signal D_TEST and the write command signal WC are activated to the logic high state, even when the ODT signal ODT is deactivated to the logic low state, the second mode determining unit 550 enables the dynamic ODT mode.

FIG. 6 illustrates an example case where the dynamic ODT mode is enabled with the delay through the dynamic ODT latency unit D_ODT_LATENCY 570 after 3.5 clock cycles have passed from when the write command signal WC has been activated to the logic high state.

While this invention has been particularly shown and described with reference to embodiments thereof, it will be understood by those skilled in the art that various changes in form and details may be made therein without departing from the spirit and scope of the invention as defined by the appended claims.

Such logic gates used in the ODT mode test apparatus 200 of FIG. 2 or 500 of FIG. 5 provide greater flexibility in enabling or disabling the normal and dynamic ODT modes in a semiconductor memory device. For example, the dynamic ODT mode may be enabled even when the normal ODT mode is disabled.

The present invention is limited only as defined in the following claims and equivalents thereof.

What is claimed is:

1. An apparatus for determining an on die termination (ODT) mode in a semiconductor memory device, the apparatus comprising:
   a first mode determining unit that disables a normal ODT mode when a dynamic ODT mode test is performed; and
   a second mode determining unit that enables a dynamic ODT mode when a write command is generated.

2. The apparatus of claim 1, wherein the first mode determining unit determines whether the normal ODT mode is enabled from an ODT signal, a dynamic ODT mode test signal, and a write command signal;
   and wherein the second mode determining unit determines whether the dynamic ODT mode is enabled from the ODT signal and the write command signal.

3. The apparatus of claim 2, wherein the first mode determining unit enables the normal ODT mode when the ODT signal is activated, the dynamic ODT mode test signal is deactivated, and the write command signal is deactivated,
   and wherein the second mode determining unit enables the dynamic ODT mode when the ODT signal and the write command signal are activated.

4. The apparatus of claim 3, wherein the first mode determining unit includes:
   a first NAND gate that inputs the ODT signal, an inversion of the dynamic ODT mode test signal, and an inversion of the write command signal; and
   a first inverter that inputs an output of the first NAND gate;
   and wherein the second mode determining unit includes:
   a second NAND gate that inputs the ODT signal and the write command signal; and
   a second inverter that inputs an output of the second NAND gate.

5. The apparatus of claim 4, further comprising:
   a normal mode latency unit that generates a normal ODT enable (N_ODT_EN) signal with a delay from an output of the first inverter; and
   a dynamic mode latency unit that generate a dynamic ODT enable (D_ODT_EN) signal with a delay from an output of the second inverter.

6. A method for determining an on die termination (ODT) mode in a semiconductor memory device, the method comprising:
   disabling a normal ODT mode when a dynamic ODT mode test is performed; and
   enabling a dynamic ODT mode when a write command is generated.

7. The method of claim 6, further comprising:
   determining whether the normal ODT mode is enabled from an ODT signal, a dynamic ODT mode test signal, and a write command signal; and
   determining whether the dynamic ODT mode is enabled from the ODT signal and the write command signal.

8. The method of claim 7, further comprising:
   enabling the normal ODT mode when the ODT signal is activated, the dynamic ODT mode test signal is deactivated, and the write command signal is deactivated; and
   enabling the dynamic ODT mode when the ODT signal and the write command signal are activated.

9. The method of claim 8, further comprising:
   performing a first NAND operation on the ODT signal, an inversion of the dynamic ODT mode test signal, and an inversion of the write command signal;
   inverting an output of the first NAND operation;
   performing a second NAND operation on the ODT signal and the write command signal; and
   inverting an output of the second NAND operation.

10. The method of claim 9, further comprising:
    generating an normal ODT enable (N_ODT_EN) signal with a delay from the inversion of the output of the first NAND operation; and
    generating a dynamic ODT enable (D_ODT_EN) signal with a delay from the inversion of the output of the second NAND operation.

11. An apparatus for determining an on die termination (ODT) mode in a semiconductor memory device, the apparatus comprising:
    a first mode determining unit that disables a normal ODT mode when an ODT signal is deactivated; and
    a second mode determining unit that enables a dynamic ODT mode when a write command is generated and a dynamic ODT mode test is performed.

12. The apparatus of claim 11, wherein the first mode determining unit determines whether the normal ODT mode is enabled from an ODT signal and a write command signal;
    and wherein the second mode determining unit determines whether the dynamic ODT mode is enabled from the ODT signal, a dynamic ODT mode test signal, and the write command signal.

13. The apparatus of claim 12, wherein the first mode determining unit enables the normal ODT mode when the ODT signal is activated and the write command signal is deactivated;
    and wherein the second mode determining unit enables the dynamic ODT mode when at least one of the ODT signal and the dynamic ODT mode test signal is activated and when the write command signal is activated.

14. The apparatus of claim 13, wherein the first mode determining unit includes:
    a first NAND gate that inputs the ODT signal and an inversion of the write command signal;
    a first inverter that inputs an output of the first NAND gate;
    and wherein the second mode determining unit includes:
    a NOR gate that inputs the ODT signal and the dynamic ODT mode test signal;
    a second NAND gate that inputs an inversion of the output of the NOR gate and the write command signal; and
    a second inverter that inputs an output of the second NAND gate.

15. The apparatus of claim 14, further comprising:
a normal mode latency unit that generates an normal ODT enable (N_ODT_EN) signal with a delay from an output of the first inverter; and
a dynamic mode latency unit that generate a dynamic ODT enable (D_ODT_EN) signal with a delay from an output of the second inverter.

16. A method for determining an on die termination (ODT) mode in a semiconductor memory device, the method comprising:
disabling a normal ODT mode when an ODT signal is deactivated; and
enabling a dynamic ODT mode when a write command is generated and a dynamic ODT mode test is performed.

17. The method of claim 16, further comprising:
determining whether the normal ODT mode is enabled from the ODT signal and a write command signal; and
determining whether the dynamic ODT mode is enabled from the ODT signal, a dynamic ODT mode test signal, and the write command signal.

18. The method of claim 17, further comprising:
enabling the normal ODT mode when the ODT signal is activated and the write command signal is deactivated; and
enabling the dynamic ODT mode when at least one of the ODT signal and the dynamic ODT mode test signal is activated and when the write command signal is activated.

19. The method of claim 18, further comprising:
performing a first NAND operation on the ODT signal and an inversion of the write command signal;
inverting an output of the first NAND operation;
performing a NOR operation on the ODT signal and the dynamic ODT mode test signal;
performing a second NAND operation on the inversion of the output of the NOR operation and the write command signal; and
inverting an output of the second NAND operation.

20. The method of claim 19, further comprising:
generating an normal ODT enable (N_ODT_EN) signal with a delay from the inversion of the first NAND operation; and
generating a dynamic ODT enable (D_ODT_EN) signal with a delay from the inversion of the second NAND operation.

* * * * *